US007333364B2

(12) United States Patent
Yu et al.

(10) Patent No.: US 7,333,364 B2
(45) Date of Patent: Feb. 19, 2008

(54) CELL-DOWNGRADING AND REFERENCE-VOLTAGE ADJUSTMENT FOR A MULTI-BIT-CELL FLASH MEMORY

(75) Inventors: Frank Yu, Palo Alto, CA (US);
Charles C. Lee, Cupertino, CA (US);
Abraham C. Ma, Fremont, CA (US);
Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 11/737,336

(22) Filed: Apr. 19, 2007

(65) Prior Publication Data

US 2007/0201274 A1    Aug. 30, 2007

Related U.S. Application Data

(63) Continuation-in-part of application No. 11/466,759, filed on Aug. 23, 2006, now abandoned, and a continuation-in-part of application No. 10/800,228, filed on Mar. 12, 2004, now Pat. No. 7,082,056, and a continuation-in-part of application No. 10/789,333, filed on Feb. 26, 2004, and a continuation-in-part of application No. 10/605,140, filed on Sep. 10, 2003, now Pat. No. 6,874,044, and a continuation-in-part of application No. 09/478,720, filed on Jan. 6, 2000, now Pat. No. 7,257,714.

(51) Int. Cl.
*G11C 16/06* (2006.01)

(52) U.S. Cl. .......................... 365/185.09; 365/185.22; 365/185.11

(58) Field of Classification Search .......... 365/185.09, 365/185.22, 185.11, 185.33, 185.02; 711/103, 711/173
See application file for complete search history.

(56) References Cited

U.S. PATENT DOCUMENTS

| 5,351,210 | A | 9/1994 | Saito |
| 5,515,317 | A | 5/1996 | Wells et al. |
| 5,942,004 | A | 8/1999 | Cappelletti |
| 6,026,015 | A | 2/2000 | Hirakawa |
| 6,097,635 | A | 8/2000 | Chang |
| 6,097,637 | A | 8/2000 | Bauer et al. |
| 6,381,174 | B1 * | 4/2002 | Roohparvar et al. ... 365/185.09 |
| 7,023,735 | B2 | 4/2006 | Ban et al. |
| 7,082,056 | B2 | 7/2006 | Chen et al. |

(Continued)

*Primary Examiner*—David Lam
(74) *Attorney, Agent, or Firm*—Stuart T. Auvinen; g Patent LLC

(57) ABSTRACT

A flash memory has multi-level cells (MLC) that can each store multiple bits per cell. Blocks of cells can be downgraded to fewer bits/cell when errors occur, or for storing critical data such as boot code. The bits from a single MLC are partitioned among multiple pages to improve error correctability using Error Correction Code (ECC). An upper reference voltage is generated by a voltage reference generator in response to calibration registers that can be programmed to alter the upper reference voltage. A series of decreasing references are generated from the upper reference voltage and are compared to a bit-line voltage. Compare results are translated by translation logic that generates read data and over- and under-programming signals. Downgraded cells use the same truth table but generate fewer read data bits. Noise margins are asymmetrically improved by using the same sub-states for reading downgraded and full-density MLC cells.

20 Claims, 11 Drawing Sheets

U.S. PATENT DOCUMENTS

| | | |
|---|---|---|
| 7,149,871 B2 | 12/2006 | Conley |
| 2003/0174540 A1 | 9/2003 | Fan et al. |
| 2006/0002197 A1 | 1/2006 | Rudelic |
| 2006/0004952 A1 | 1/2006 | Lasser |
| 2006/0101193 A1 | 5/2006 | Murin |

* cited by examiner

| 3 | 3 | 3 | 3 | 3 | • • • |
|---|---|---|---|---|---|
| 3 | 3 | 3 | 3 | 3 | PAGES 0-63 |
| 3 | 3 | 3 | 3 | 3 | |
| 3 | 3 | 3 | 3 | 3 | 16 |
| 2 | 2 | 2 | 2 | 2 | • • • |
| 2 | 2 | 2 | 2 | 2 | PAGES 64-127 |
| 2 | 2 | 2 | 2 | 2 | |
| 2 | 2 | 2 | 2 | 2 | 17 |
| 1 | 1 | 1 | 1 | 1 | • • • |
| 1 | 1 | 1 | 1 | 1 | PAGES 128-191 |
| 1 | 1 | 1 | 1 | 1 | |
| 1 | 1 | 1 | 1 | 1 | 18 |
| 0 | 0 | 0 | 0 | 0 | • • • |
| 0 | 0 | 0 | 0 | 0 | PAGES 192-255 |
| 0 | 0 | 0 | 0 | 0 | |
| 0 | 0 | 0 | 0 | 0 | 19 |

FIG. 3

16-BYTE SPARE AREA 1

| BAD BLKS | BITS/ CELL | VAL | ECC | 21 |
|---|---|---|---|---|

16-BYTE SPARE AREA 2

| LBA | W/L | VAL | ECC | 22 |
|---|---|---|---|---|

16-BYTE SPARE AREA 3

| LBA | W/L | VAL | ECC | 23 |
|---|---|---|---|---|

16-BYTE SPARE AREA 4

| LBA | | VAL | ECC | 24 |
|---|---|---|---|---|

FIG. 4

SPECIAL BLOCK

| VALID DATA | BITS/ CELL | W/L | W/L | 20 |
|---|---|---|---|---|

FIG. 5

| READ SUB-STATE | IL0 | IU0 | IR1 | IL1 | IU1 | IR2 | IL2 | IU2 | IR3 | IL3 | IU3 | RD-D1 | RD-D0 | READ-IN-RANGE | OVER | UNDER |
|---|---|---|---|---|---|---|---|---|---|---|---|---|---|---|---|---|
| 1 | 1 | 1 | 1 | 1 | 1 | 1 | 1 | 1 | 1 | 1 | 1 | 1 | 1 | 0 | 0 | 1 |
| 2 | 0 | 1 | 1 | 1 | 1 | 1 | 1 | 1 | 1 | 1 | 1 | 1 | 1 | 1 | 0 | 0 |
| 3 | 0 | 0 | 1 | 1 | 1 | 1 | 1 | 1 | 1 | 1 | 1 | 1 | 1 | 0 | 1 | 0 |
| 4 | 0 | 0 | 0 | 1 | 1 | 1 | 1 | 1 | 1 | 1 | 1 | 1 | 0 | 0 | 0 | 1 |
| 5 | 0 | 0 | 0 | 0 | 1 | 1 | 1 | 1 | 1 | 1 | 1 | 1 | 0 | 1 | 0 | 0 |
| 6 | 0 | 0 | 0 | 0 | 0 | 1 | 1 | 1 | 1 | 1 | 1 | 1 | 0 | 0 | 1 | 0 |
| 7 | 0 | 0 | 0 | 0 | 0 | 0 | 1 | 1 | 1 | 1 | 1 | 0 | 1 | 0 | 0 | 1 |
| 8 | 0 | 0 | 0 | 0 | 0 | 0 | 0 | 1 | 1 | 1 | 1 | 0 | 1 | 1 | 0 | 0 |
| 9 | 0 | 0 | 0 | 0 | 0 | 0 | 0 | 0 | 1 | 1 | 1 | 0 | 1 | 0 | 1 | 0 |
| 10 | 0 | 0 | 0 | 0 | 0 | 0 | 0 | 0 | 0 | 1 | 1 | 0 | 0 | 0 | 0 | 1 |
| 11 | 0 | 0 | 0 | 0 | 0 | 0 | 0 | 0 | 0 | 0 | 1 | 0 | 0 | 1 | 0 | 0 |
| 12 | 0 | 0 | 0 | 0 | 0 | 0 | 0 | 0 | 0 | 0 | 0 | 0 | 0 | 0 | 1 | 0 |

FIG. 8

| READ SUB-STATE | IL0 | IU0 | IR1 | IL1 | IU1 | IR2 | IL2 | IU2 | IR3 | IL3 | IU3 | RD-D1 | RD-D0 | READ-IN-RANGE | OVER | UNDER |
|---|---|---|---|---|---|---|---|---|---|---|---|---|---|---|---|---|
| 1 | 1 | 1 | 1 | 1 | 1 | 1 | 1 | 1 | 1 | 1 | 1 | 1 | - | 0 | 0 | 1 |
| 2 | 0 | 1 | 1 | 1 | 1 | 1 | 1 | 1 | 1 | 1 | 1 | 1 | - | 1 | 0 | 0 |
| 3 | 0 | 0 | 1 | 1 | 1 | 1 | 1 | 1 | 1 | 1 | 1 | 1 | - | 1 | 0 | 0 |
| 4 | 0 | 0 | 0 | 1 | 1 | 1 | 1 | 1 | 1 | 1 | 1 | 1 | - | 1 | 0 | 0 |
| 5 | 0 | 0 | 0 | 0 | 1 | 1 | 1 | 1 | 1 | 1 | 1 | 1 | - | 1 | 0 | 0 |
| 6 | 0 | 0 | 0 | 0 | 0 | 1 | 1 | 1 | 1 | 1 | 1 | 1 | - | 0 | 1 | 0 |
| 7 | 0 | 0 | 0 | 0 | 0 | 0 | 1 | 1 | 1 | 1 | 1 | 0 | - | 0 | 0 | 1 |
| 8 | 0 | 0 | 0 | 0 | 0 | 0 | 0 | 1 | 1 | 1 | 1 | 0 | - | 1 | 0 | 0 |
| 9 | 0 | 0 | 0 | 0 | 0 | 0 | 0 | 0 | 1 | 1 | 1 | 0 | - | 1 | 0 | 0 |
| 10 | 0 | 0 | 0 | 0 | 0 | 0 | 0 | 0 | 0 | 1 | 1 | 0 | - | 1 | 0 | 0 |
| 11 | 0 | 0 | 0 | 0 | 0 | 0 | 0 | 0 | 0 | 0 | 1 | 0 | - | 1 | 0 | 0 |
| 12 | 0 | 0 | 0 | 0 | 0 | 0 | 0 | 0 | 0 | 0 | 0 | 0 | - | 0 | 1 | 0 |

CELL-DOWNGRADING AND REFERENCE-VOLTAGE ADJUSTMENT FOR A MULTI-BIT-CELL FLASH MEMORY

RELATED APPLICATION

This application is a continuation-in-part of the application for "Electronic Data Storage Medium with Fingerprint Verification Capability", U.S. Ser. No. 09/478,720, filed Jan. 6, 2000, now U.S. Pat. No. 7,257,714 and "Flash Memory Controller for Electronic Data Flash Card" U.S. Ser. No. 11/466,759, filed Aug. 23, 2006, which is a CIP of "System and Method for Controlling Flash Memory", U.S. Ser. No. 10/789,333, filed Feb. 26, 2004, now abandoned.

This application is related to "Flash memory device and architecture with multi level cells", U.S. Ser No. 10/800,228, filed Mar. 12, 2004, now U.S. Pat. No. 7,082,056, and "Flash drive/reader with serial-port controller and flash-memory controller mastering a second RAM-buffer bus parallel to a CPU bus", U.S. Ser. No. 10/605,140, filed Sep. 10, 2003, now U.S. Pat. No. 6,874,044.

FIELD OF THE INVENTION

This invention relates to multi-bit-cell (MBC) or multi-level-cell (MLC) flash-memory systems, and more particularly to downgrading multi-bit flash blocks when errors occur.

BACKGROUND OF THE INVENTION

Hard disk drives are commonly used in personal computers (PC's), servers, video recorders, and many other kind of electronic devices for mass storage. Mass storage is used to store large amounts of data that is typically copied to a faster random-access memory such as a dynamic-random-access memory (DRAM) for use by a processor. While the processor's DRAM is randomly accessible, mass storage is block-accessible. An entire block of data must be read or written from the mass storage device. A RAM may allow reading and writing of individual bytes or words of 4 or 8 bytes, while a mass storage device requires that a sector or 512 bytes or more be read or written together.

Flash memory may also be used as a mass storage device in lieu of a hard disk. Flash-memory arrays are also block-accessible, but have a much faster access time than rotating media such as a hard disk. However, since flash memory chips are block-addressable rather than randomly-accessible, flash is not as easy to use for a cache as DRAM or SRAM.

A host generates a logical sector addresses (LSA) of a 512-byte block of data to be read or written from a mass storage device. Flash memory can only be erased a block at a time. A flash memory manager converts LSA logical addresses from a host PC into physical block addresses (PBA) that identify physical blocks of data in the flash memory. The flash memory manager may use re-mapping tables to perform the address translation, and may perform other flash-related functions such as wear-leveling to spread erasures over blocks in flash memory. An erase count may be kept for each block in flash memory, and the block with the lowest erase count is selected to receive new data.

While an entire block has to be erased together, pages within a block could be written and over-written several times. Some older flash memory chips may allow over-writing of pages that have previously been written. Blocks with all stale pages could be erased and re-used.

FIG. 1A is a graph of cell states in an older single-level-cell (SLC) flash memory. Older flash memory chips used electrically-erasable programmable read-only memory (EEPROM) memory cells that stored one bit of data per memory cell. Each cell could be in one of two states. When the floating gate in the flash memory cell was charged with electrons, a higher (more positive) gate voltage is needed to turn on the conducting transistor channel. When the floating gate in the flash memory cell was not charged with electrons, a lower (less positive) gate voltage is needed to turn on the conducting transistor channel.

In FIG. 1A, a gate voltage between VL0 and VL1 is sufficient to cause the transistor to turn on and conduct when the cell was programmed into the low state. When the cell was programmed into the high state, no significant conduction occurs at these lower voltages. Instead, conduction occurs when the gate voltage rises to a voltage between VL1 and VU1 when the cell was programmed into the high state. A single reference voltage VR1 separates the two states of the cell.

The cell state strength (a statistical distribution of cells) is a maximum between lower and upper voltages VL0, VU0 for the low or 0 state when properly programmed. The cell state strength for the high or 1 state is a maximum between voltages VL1, VU1. When the cell is programmed correctly, sufficient noise margin is provided and the cell states do not overlap.

FIG. 1B shows cell states in a newer multi-level-cell (MLC) flash memory. Newer flash memory chips use EEPROM memory cells that stored two, four, or more bits of data per memory cell. Different amounts of charge stored on the floating gates produce different current and different sensing voltages for the same memory cell. Thus a single memory cell can store multiple bits of information by assigning different voltages to different logic levels.

For example, sensing voltages above VR3, near Vcc, are read as a logic 11, while sensing voltages below VR1 near ground are interpreted as a logic 00. Voltages above VR2 and below VR3 are a logic 10, and voltages below VR1 but above VR1 are a logic 01. The normal logic states can have a narrower voltage range, such as VL0, VR0.

Cells are carefully programmed with just the right amount of charge to produce voltages within one of the four ranges. During programming, the allowable voltage ranges are further reduced to add a noise margin. As cells are programmed, they can be read for their sensing voltage, and programming stopped when the sensing voltage is near the middle of the desired range.

For example, when writing the cell into state 01, the cell is programmed so that the sensing voltage is between the narrower range of VL1, VU1. During reading, any voltage in the wider range of VR1 to VR2 is read as state 01. Thus the difference between VL1 and VR1, and also between VR2 and VU1, are noise margins.

FIG. 1C shows cell states in a 16-level MLC flash memory. Each flash cell stores 4 binary bits of data, and has 16 levels or states. State 1111 is programmed to create a sensing voltage between VL0, VU0, and is sensed during reading when the sensing voltage is below VL1. State 1110 is programmed to create a sensing voltage between VL1, VU1, and is read as any voltage between VR1, VR2. State 0001 is programmed to create a sensing voltage between VL14, VU14, and is read as any voltage between VR14, VR15. State 0000 is programmed to between VL15, VU15, and read as voltages above VR15. There are a total of 16 states for each flash-memory cell.

Multi-level-cell flash memory can store a higher density than single-level cell flash for the same cell size. Thus multi-level cell flash is likely to be used more frequently for higher-density flash chips made now and in the future. However, MLC flash chips may impose additional restrictions on usage. For example, a MLC flash chip may not allow pages to be written a second time before erase. Instead, the entire block must be erased before any page can be written again. Each page may be written only once after each erase. Alternately, some writing may be allowed, such as writing a 1 bit to a 0 bit, but other writes are not allowed, such as writing a 0 bit to a 1 bit. Some MLC flash chips may be even more restrictive, only allowing pages to be written in a sequence within a block, and not allowing pages to be written out-of-order.

Another problem with MLC cells, especially with many states per cell, is that the noise margins are very small. Over time, floating gates can gain or lose charge. Programming or reading adjacent cells may disturb stored charge, or leakage may occur. Cells that were programmed to the middle of their range, such as VL14 to VU14 for state 14, may eventually drift outside of their programmed range (VL14, VU14). Once cells drift outside of their reading range (VR14, VR15 for state 14), then the wrong cell state is read, and a data failure occurs.

While MLC cells with a high number of states per cell is desirable for improved density, data failures from read or program disturbs, or leakage, becomes a greater problem as the number of states per cell increases and the noise margins decrease. A flexible management scheme that compensates for the smaller noise margins is desirable. Using error correction such as Reed-Solomon Error Correction Code (ECC) can repair small data errors, but when even a single multi-level cell fails, a string of multiple bits may fail that is not correctable using ECC.

What is desired is a flash memory manager for MLC flash memory. A flash memory manager that downgrades the number of bits per cell is desirable.

BRIEF DESCRIPTION OF THE DRAWINGS

FIG. 3 shows sub-block partitioning of the multiple bits in each MLC flash cell.

FIG. 4 shows a spare area that store an indicator of the number of bits per flash cell.

FIG. 5 shows a bits-per-cell indicator stored in a special block.

FIG. 8 is a truth table for the translation logic for a 2-bit MLC.

FIG. 9 is a truth table of for the translation logic when a 2-bit flash cell has been downgraded to 1 bit.

FIG. 10 is a composite truth table for 3-bit flash cells that can be downgraded to 2-bits or 1-bit per cell.

DETAILED DESCRIPTION

The present invention relates to an improvement in flash-memory managers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2A:
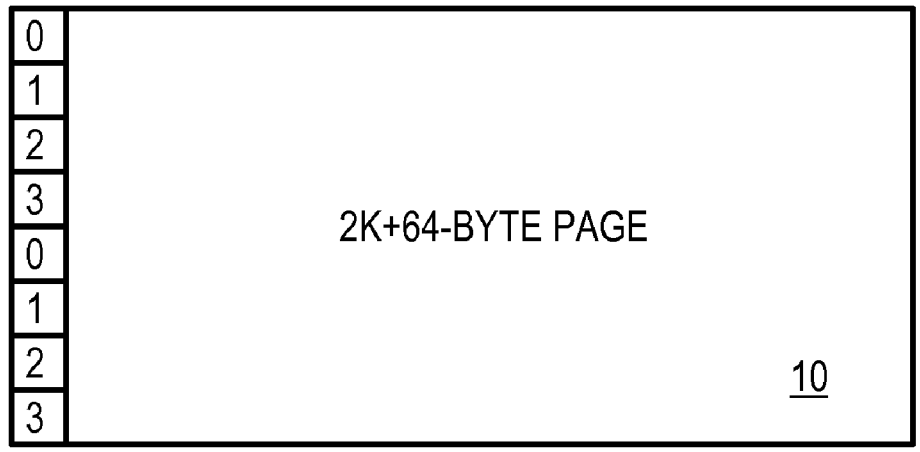
FIGS. 2A-B shown arrangements of multiple bits per flash cell.
Figure 2B:
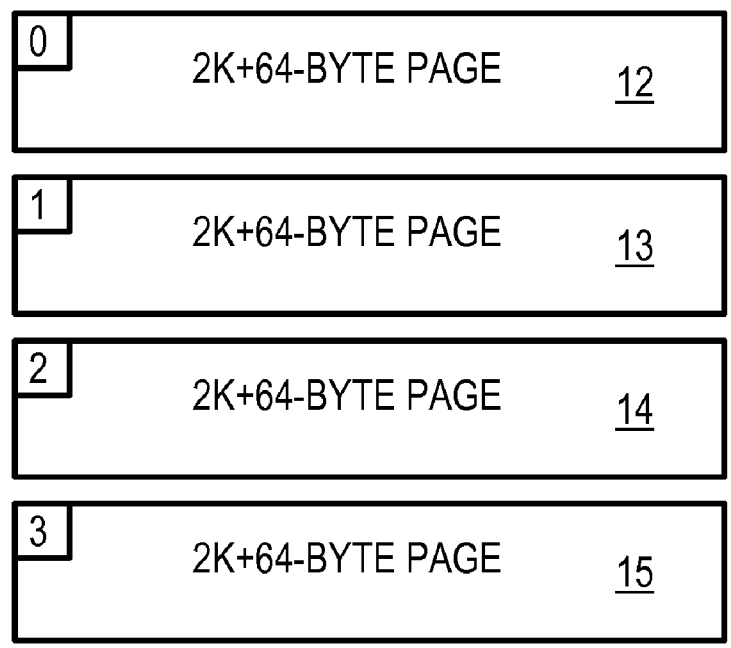

FIGS. 2A-B shown arrangements of multiple bits per flash cell. In FIG. 2A, all 4 bits in a single 16-level flash cell are arranged sequentially in the same flash page. Flash page 10 is a 2K-byte page that also has 64 'spare' bytes for ECC, overhead, and management purposes. Since each 16-level flash cell represents four bits (shown as 0, 1, 2, 3 in FIG. 2A), 512 flash cells make up the 2K data portion of flash page 10.

In FIG. 2B, the four bits 0, 1, 2, 3 of a single 16-level flash cell are partitioned across four flash pages 12, 13, 14, 15. Each flash page has bits from 2K flash cells, but only has one bit per flash cell. This partitioned arrangement is desirable since ECC bytes in the spare area of each flash page only has to correct one bit when a single flash cell fails, while in FIG. 2A the ECC bytes may have to correct all 4 bits from the one faulty flash cell. Thus error correction is improved by the partitioned data arrangement of FIG. 2B.

FIG. 3 shows sub-block partitioning of the multiple bits in each MLC flash cell. Rather than partition the four bits per cell across four pages in the same block, as shown in FIG. 2B, the four bits are partitioned across separate sub-blocks. In this example, each flash block has four sub-blocks 16, 17, 18, 19, and each sub-block has 64 flash pages. Alternately, each of sub-blocks 16-19 could be a block.

Bits 3 of MLC flash cells are located in the first 64 pages of each block, sub-block 16. Bits 2 of MLC flash cells are located in the second 64 pages of each block, sub-block 17, while bits 1 are located in the third 64 pages, sub-block 18. Bits 0 of MLC flash cells are located in the last 64 pages of each block, sub-block 19.

This block or sub-block partitioning spreads bits from the same flash cell farther apart. Bits from one cell are separated by 64 pages, or 129K bytes. This separation may spread multi-cell errors over more pages, allowing for a greater likelihood that the ECC bytes can correct the multiple errors.

FIG. 4 shows a spare area that store an indicator of the number of bits per flash cell. Each flash page has a 64-byte spare area that is used for error correction and overhead. The 64-byte spare area for each page is further divided into four spare sets. Spare sets 21-24 store ECC bytes for the page in the last 13 bytes of each 16-byte spare set. A total of 13 ECC bytes are provided for every 512-byte sector, allowing for significant error detection and correction.

The third byte of each spare set 21-24 stores valid bits for the four 512-byte sectors within each 2K page. The valid bits can indicate that a sector is valid, invalid, or empty (pre-erased). Other status information may also be indicated.

The first byte of spare sets 22, 23, 24 stores the logical block address (LBA) for the page or block. The LBA can be from the host, or can be generated from the logical sector address (LSA). A portion of a wear-leveling counter (W/L) for the block is stored in the second bytes of spare sets 22, 23. The first byte of first spare set 21 stores a bad block indicator that can be set to indicate that the block is faulty and should not be used for storing new data. The bad block indicator can be all 1's for a good block, or any value with a 0 bit for a bad block.

MLC Downgrading of Bits/Cell

The second byte of first spare set 21 stores a bits-per-cell indicator. The bits-per-cell indicator indicates how many bits are stored for each flash cell in the block. For example, when 16-level flash cells are used, storing 4 bits for each cell, the bits-per-cell indicator can be set to 4.

When failures occur, the block can be marked as a bad block and never used again. However, with high-density, low-noise-margin flash cells such as 16-level cells, failures may occur more often than with lower-density flash cells. Too many block may be marked as bad, reducing the size of the memory that is available.

Rather than permanently mark block as bad and never re-using the bad blocks, the faulty blocks may be downgraded. When downgrading is successful, the downgraded block may continue to be used for storing data, although at a lower density.

Faulty blocks are downgraded by reducing the number of bits stored per flash cell. The bits-per-cell indicator in spare set 21 (FIG. 4) is reduced to indicate fewer bits per cell. When there are fewer bits per cell and fewer states per cell, the states occupy a larger range of voltages, and thus have larger noise margins. The downgraded cells are more likely to operate correctly with the larger noise margins afforded by the fewer possible states per cell. Read and program disturbs must be larger, more severe, to disturb downgraded cells, and permissible leakage currents can be larger.

For example, a block of flash cells storing 4 bits per cell has too many data errors and is downgraded. The bits-per-cell indicator is changed from 4 to 2. The block now stores only 2 bits per flash cell. Since the noise margins are larger when the flash cell stored only 2 bits, the flash cell is more likely to operate correctly than when the flash cell stored 4 bits per cell.

FIG. 5 shows a bits-per-cell indicator stored in a special block. One or more flash blocks can be designated as a special block that does not store data. The special block can store important system-wide management information. Since this information is so important, the flash cells in the special block store only 1 bit per cell, maximizing their noise margins and time-to-failure.

Special block 20 stores 4 bytes for each flash block in the system. The first byte stores a data-valid indicator to indicate when the block is storing valid data, or is empty or invalid.

The second byte stores a copy of the bits-per-cell indicator for that block. While each page stored its own bits-per-cell indicator in FIG. 4, the system may require that all bytes in a page be written at the same time, including the spare area. The system can first read the bits-per-cell indicator from special block 20 before writing data and management information from the block itself, knowing how may bits per cell to look for.

A 2-byte wear-leveling counter is also stored for each block. Blocks with the lowest wear-leveling count values may be chosen for receiving new data to even wear.

Figure 6:
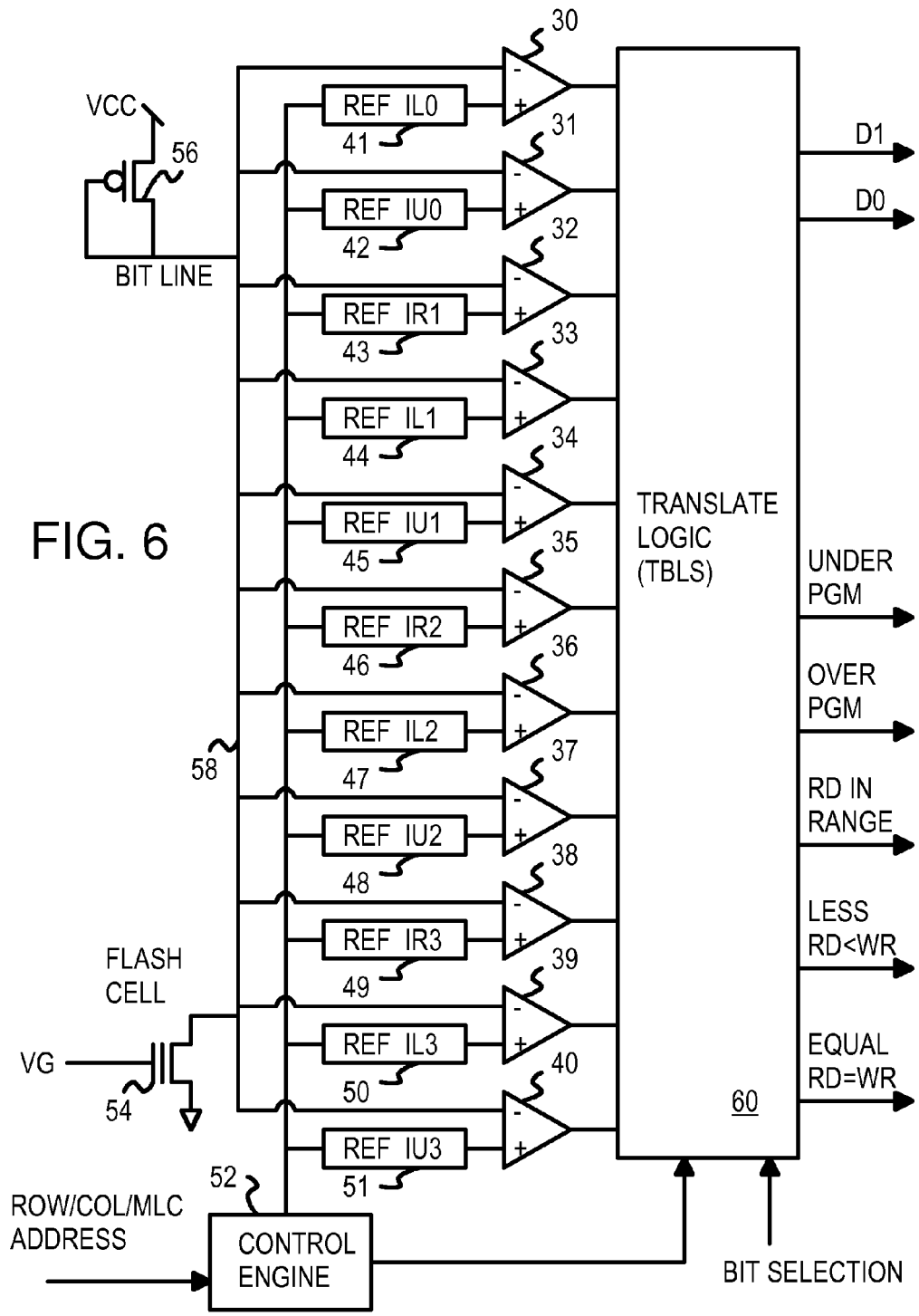
FIG. 6 shows multi-level voltage sensing of a MLC cell.

FIG. 6 shows multi-level voltage sensing of a MLC cell. The example of FIGS. 6-9 show a 2-bit, 4-state MLC, but other examples could be devised for other sizes, such as 4-bit MLC's.

A flash-memory chip has an array of flash cells arranged in rows and columns that are selectable by a row portion of an address and a column portion of an address. The address may be generated internally by a sequencer from a block or page address that is input to the flash-memory chip. A third part of the address effectively selects the bit within a MLC cell.

Control engine 52 receives the address and selects one or more flash cells at an intersection of the selected row and column. The MLC address is sent to translation logic 60, which generates multiple bits per cell. One or more of the bits per cell output by translation logic 60 is selected by the MLC address from control engine 52. Typically, 8 or more flash cells are read and sensed in parallel on 8 or more bit lines by 8 or more copies of translation logic 60, but only bit slice is shown.

Bit line 58 is pre-charged by pull-up transistor 56. Selected flash cell 54 is at the intersection of the selected row and column, and has a gate voltage VG applied that may turn on its channel, depending on the state of selected flash cell 54. The different states that may be programmed into selected flash cell 54 each store a different amount of charge on the floating gate of selected flash cell 54, and each state thus causes a different amount of channel current to pass through selected flash cell 54, from bit line 58 to ground. The variable current through selected flash cell 54, combined with the pull-up current from pull-up transistor 56 forms a voltage divider. The voltage on bit line 58 thus varies with the state that was programmed into selected flash cell 54.

Figure 1A:
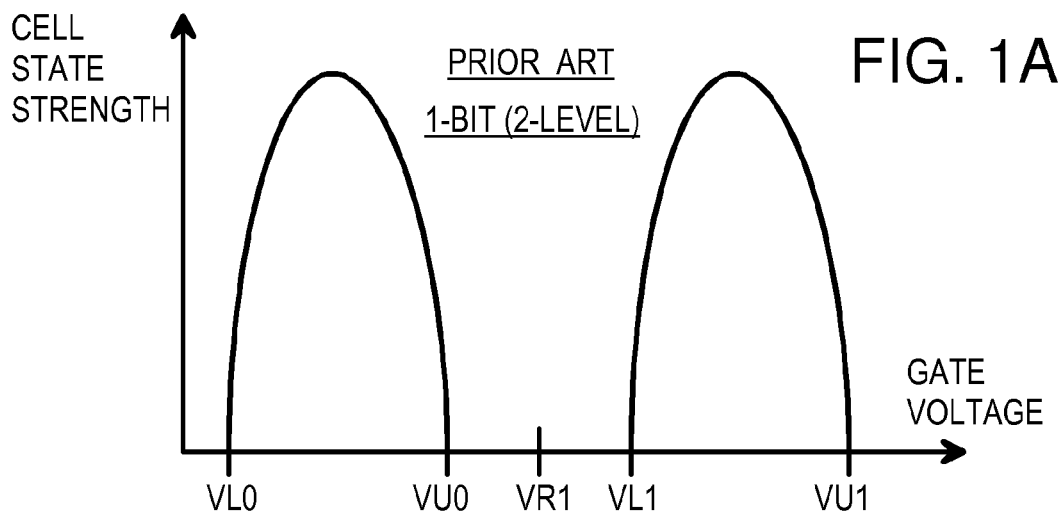
FIGS. 1A-C is a graph of cell states in an older single-level-cell (SLC) flash memory.
Figure 1B:
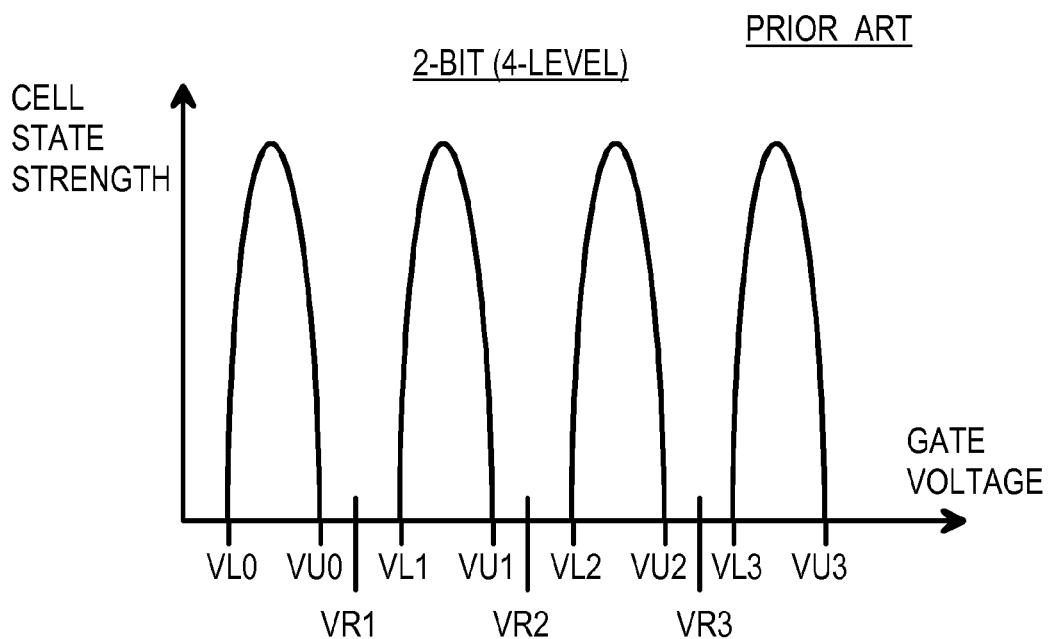
Figure 1C:
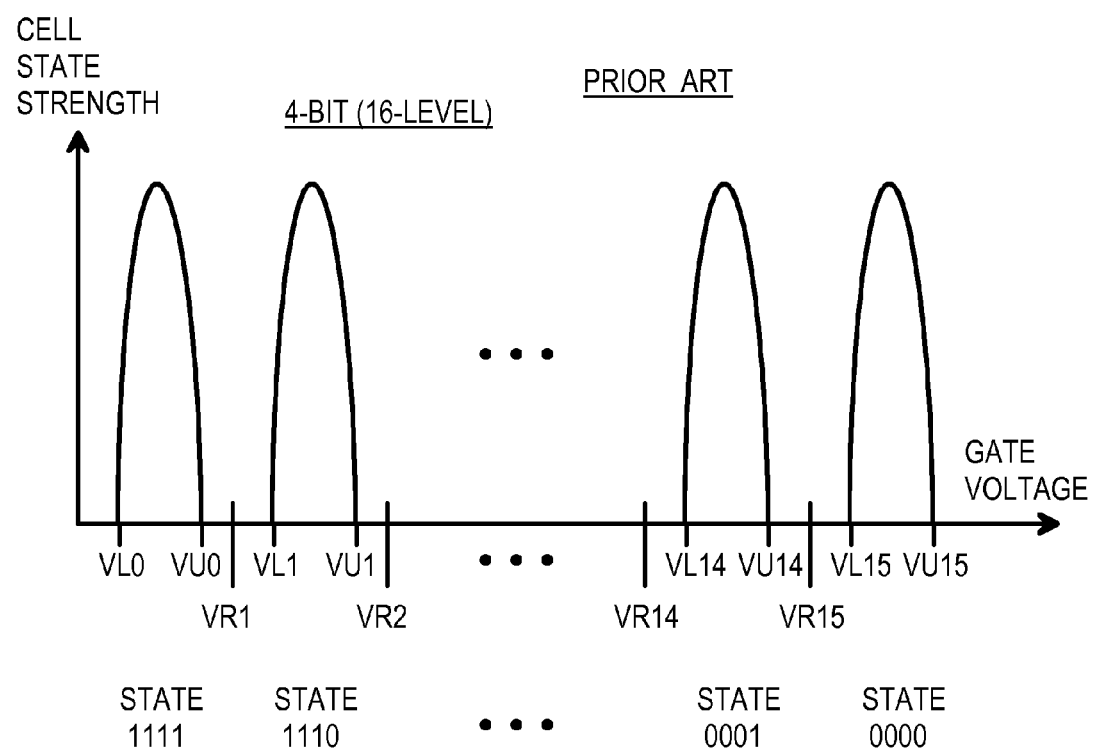

Bit line 58 is applied to the inverting inputs of comparators 30-40. The non-inverting inputs to comparators 30-40 are reference voltages that are generated by reference-current generators 41-51. The voltages generated by reference-current generators 41-51 are controlled by control engine 52 and correspond to the reference, upper, and lower state voltages shown in FIG. 1B for sensing the four cell states.

The voltages generated by reference-voltage generators 41-51 are successively higher voltages, so that the bit-line voltage exceeds the lower references, clearing the outputs of the lower-state comparators, while the bit-line voltage does not exceed the higher references, causing the outputs of higher-state references to remain set. The location of the transition from comparators 30-40 outputting a 0 to comparators 30-40 outputting a 1 indicates the sensed voltage of bit line 58. For example, when comparators 30-37 output a 0 and comparators 38-40 output a 1, the transition from 0 to 1 occurs between comparators 37, 38. Voltage IU2 is applied to comparator 37 while voltage IR3 is applied to comparator 38. The voltage of bit line 38 is between IU2 and IR3, which is read as state 3 (01).

Translation logic 60 receives 11 comparator outputs from comparators 30-40 and detects the location of the transition from 0 to 1. Translation logic 60 generates several outputs, such as read data D1, D0, which are 2 binary bits that encode the state read from the cell. A 4-bit MLC would have a translation logic that outputs four read-data bits D3, D2, D1, D0.

Other outputs from translation logic 60 are useful during cell programming. As the cell is slowly charged or discharged during programmed, the voltage on bit line 58 changes. Programming stops once the desired data is read from data-read outputs D1, D0. However, to ensure a sufficient noise margin, the bit-line voltage should be between the upper and lower state voltages, such as VL2, VU2, rather than just between the adjacent read-reference voltages, such as VR2, VR3. The under-program output is activated when the bit-line voltage is between VR2 and VL2, while the over-program output is activated when the bit-line voltage is between VU2 and VR3. When the bit-lien voltage is between the target of VL2, VU2, neither the under-program nor the over-program outputs are activated. The read-in-range output can then be activated.

The less and equal outputs can also be activated to indicate when a desired cell value has been reached. Bit selection inputs can supply the write data to translation logic 60 to allow the less and equal outputs to target one logic state. Translation logic 60 can implement a truth table, such as shown later in FIGS. 8-10. Reference-current generators 41-51 can generate reference currents or reference voltages when comparators 30-40 are current comparators, since the reference current sent through a resistance generates a reference voltage.

Figure 7:
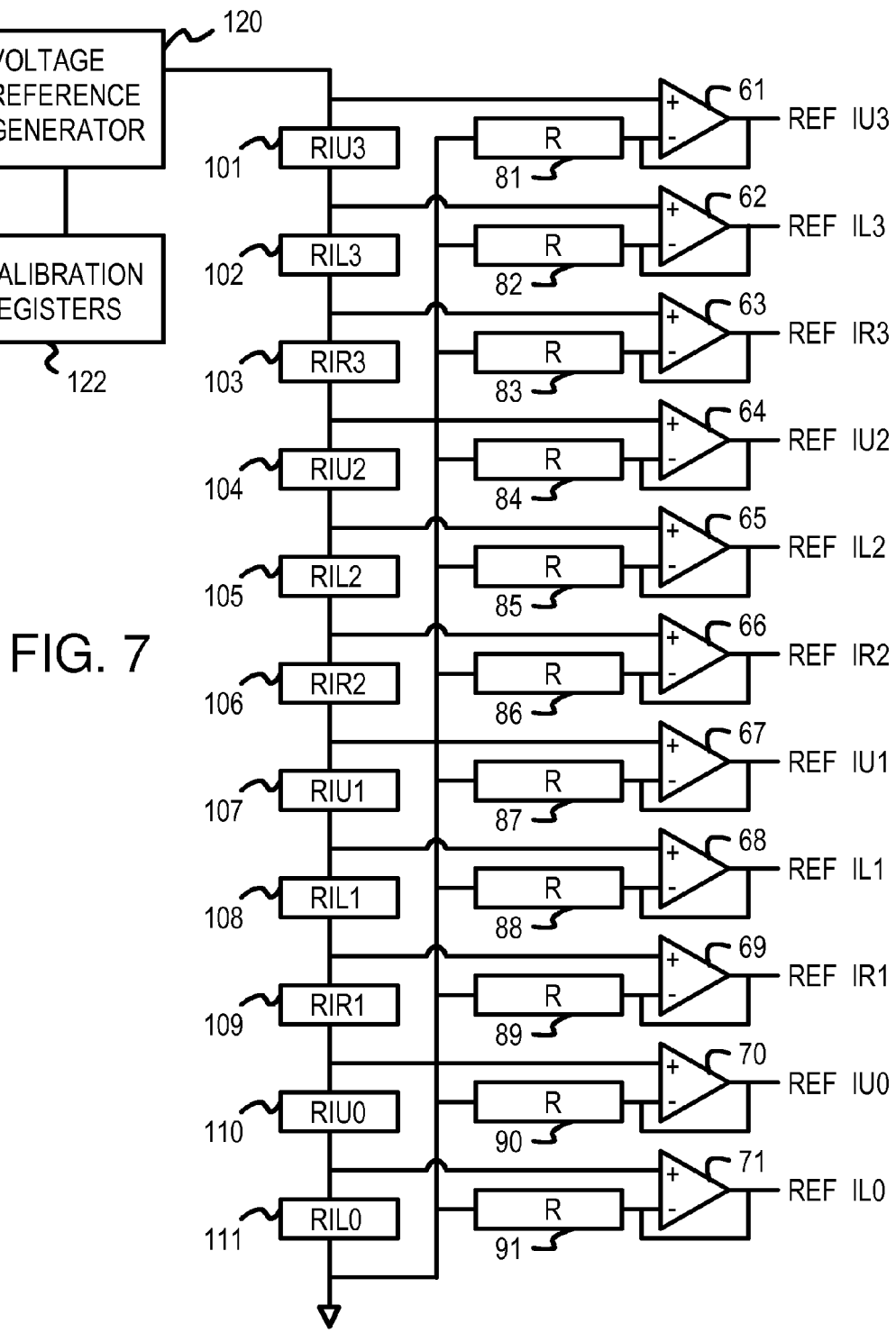
FIG. 7 shows a programmable series of reference generators and comparators.

FIG. 7 shows a programmable series of reference generators and operational amplifiers. Voltage reference generator 120 generates an upper reference voltage that is applied to upper operational amplifier 61 and to upper resistor 101. Calibration registers 122 can be programmed to different values to adjust the value of the upper reference voltage generated by voltage reference generator 120.

The upper reference voltage is applied to a chain of resistors 101-111, forming a voltage divider to ground. The resistance values of each resistor 101-111 can be the same, so that the voltage difference between the upper reference voltage and ground can be split into 11 equal voltage segments, producing 11 divider voltages. Alternately, each resistor 101-111 can have a different programmable value to provide more voltage control.

Each of the divider voltages from resistors 101-111 is applied to the non-inverting (+) input of one of operational amplifiers 61-71. The output and inverting (−) input of each of operational amplifiers 61-71 are connected together for very high gain. The inverting inputs are connected to ground through grounding resistors 81-91, which can all have the same resistance values. Each of operational amplifiers 61-71 produces a reference voltage that is equal to the divider voltage applied to its non-inverting input. Thus 11 reference voltages are produced that have voltage values that steadily increase. These reference currents correspond to those produced by reference-voltage generators 41-51 of FIG. 6.

When data errors occur during reading of flash cells, the reference voltages that are compared to the bit-line voltage can be adjusted to try to recover the data in the flash cell. For example, leakage may have reduced the charge stored in the floating gate of the flash cell, causing too much current to be drawn through the channel of selected flash cell 54 (FIG. 6). The bit-line voltage is thus lowered. Calibration registers 122 can be re-programmed to reduced the upper reference voltage that voltage reference generator 120 creates, lowering all of the reference voltages applied to operational amplifiers 61-71. The bit-line voltage may now fall within the correct reference values, allowing the data to be read without exceeding the maximum allowable ECC errors.

Calibration registers 122 could be gradually changed until the data read has no errors. The ECC bytes can be used to detect errors, so when the ECC checker reports few or no errors, then the reference-voltage adjustment can stop and the data read. The block can be relocated.

FIG. 8 is a truth table for the translation logic for a 2-bit MLC. The outputs of comparators 30-40 (FIG. 6) are shown as columns IL0, IU0, IR1, . . . IL3, IU3. These comparator outputs are inputs to translation logic 60 and thus are inputs to the truth table of FIG. 8. The right-most 5 columns (read data D1, D0, in-range, over-program and under-program) are the outputs produced by the truth table and by translation logic 60 which implements this truth table.

The selected flash cell 54 (FIG. 6) stores 2 binary bits in 4 levels. These in-range levels correspond to read sub-states 2, 5, 8, 11 and produce data outputs D1, D0 of 11, 10, 01, 00, respectively. The read in-range output is activated when the bit-line voltage is between upper and lower voltage references for that state, such as between VL0 and VU0. The IL0 comparator (30 in FIG. 6) outputs a 0 while the IU0 comparator (31 in FIG. 6) outputs a 1 in sub-state 2. Other comparators 32-40 also output a 1, as shown in row 2 of the table.

When the bit-line voltage is not between the upper and lower references for a state, the in-range signal is not activated (=0). Instead, one of the over- or under-program signals is activated. For example, when the bit-line voltage is between VL0 and VR1, (row 3), the over-program signal is activated. The bit-line voltage is a little too high. The correct data is still output as D1, D0, but the noise margin is violated. A further shift in programmed charge can cause the wrong data values to be read next time. Action can be taken to relocate the data to a new block.

The reference voltages could be shifted downward slightly to compensate for the over-programming, and/or the data could be copied to a new block. The over- and under-program signals indicate when the flash cell is no longer programmed to the target range. During programming, the under- and over-program signals can be used to determine when to half programming to get the flash cell to the ideal charge.

FIG. 9 is a truth table of for the translation logic when a 2-bit flash cell has been downgraded to 1 bit. When too many errors occur, the flash block can be downgraded from 2 bits per cell to 1 bit per cell. Noise margins are improved, although memory density drops. Translation logic 60 can be re-programmed, or operate to implement a different truth table for a 1 bits-per-cell block than for a 2 bits-per-cell block.

For this example of 2-bit MLC flash, blocks that have a bits-per-cell indicator (FIG. 4) that indicates 2 bits per cell use the truth table of FIG. 8 when translation logic 60 reads the cells. Downgraded blocks that have a bits-per-cell indicator (FIG. 4) that indicates 1 bit per cell use the truth table of FIG. 9 when translation logic 60 reads the cells.

FIG. 9 has the same inputs as does FIG. 8, which are the outputs from comparators 30-40 (FIG. 6). However, only one data bit (D1) is output. The other data bit (D0) is not generated, or is ignored or not used as data. Thus only 1 bit rather than 2 bits are read from each flash cell in a downgraded block.

FIG. 9 has the same 12 sub-states as did FIG. 8, but has 4 in-range states (rows 2-5) that generate read data D1=1, and 4 more in-range states (rows 8-11) that generate read data D1=0. Noise margins are improved with the merged states.

During programming of a downgraded block, the cell is programmed until sub-states 2-5 are reached when the cell is programmed to a logic 1. When the cell is programmed to a logic 0, sub-states 8-11 are programmed. Programming is stopped when the read in-range indicator for that sub-state is reached.

Since there are 4 sub-states per logical state in a downgraded cell, noise margins and thus reliability increase. For example, when the cell is programmed into sub-state 5, the bit-line voltage is initially between voltages VL1, VU1. However, the correct logic 1 is read between reference voltages VR2 and ground. The upper noise margin between VU1 and VR2 does not change, but the lower noise margin is increased from VL1, VR1 to VL1, ground. Thus the noise margins are improved.

Figure 10:
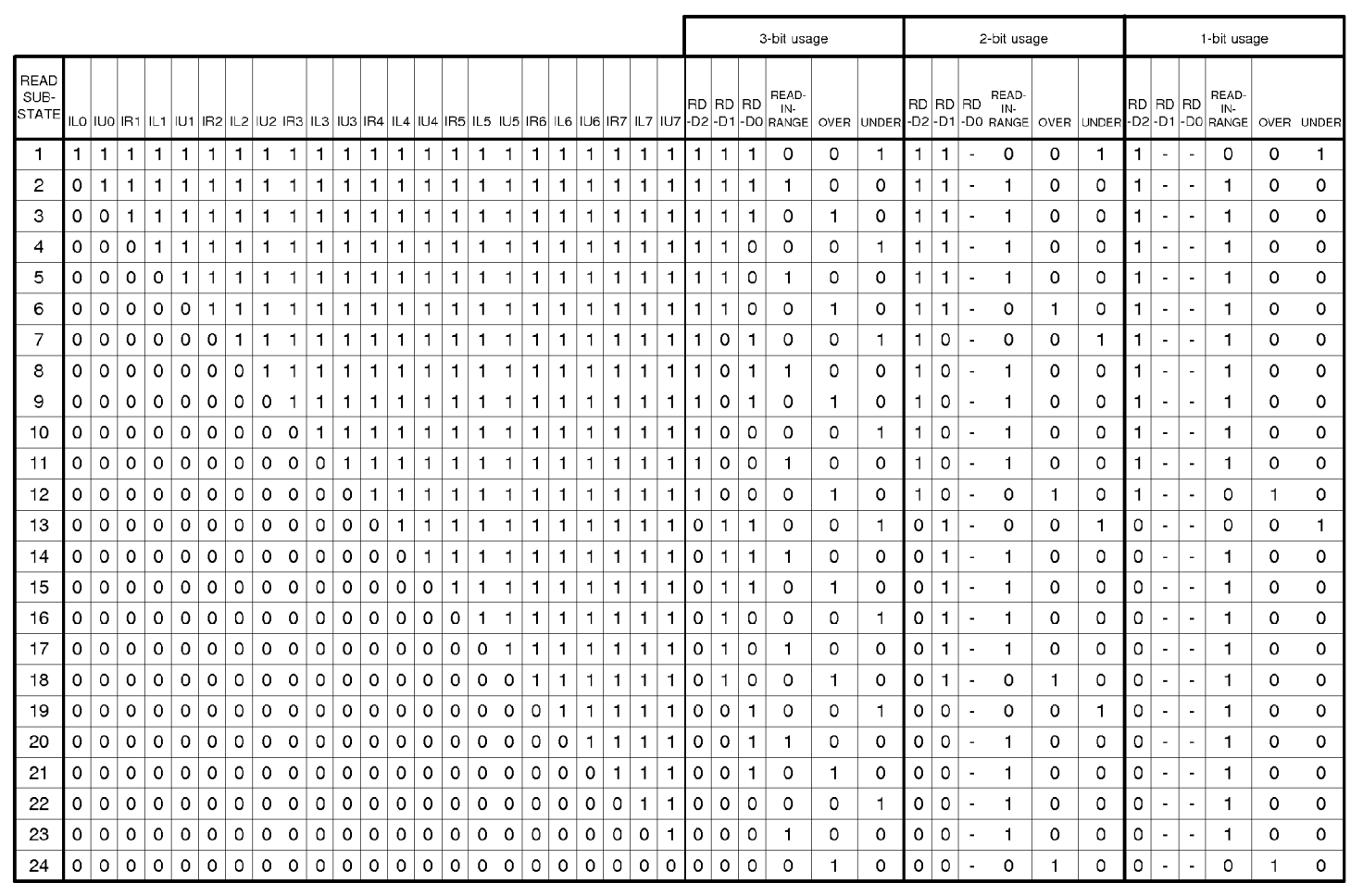

FIG. 10 is a composite truth table for 3-bit flash cells that can be downgraded to 2-bits or 1-bit per cell. In this expanded example, each flash-memory cell has 8 levels, and can store 3 binary bits. These MLC flash cells can be downgraded to store just 2 bits per cell, or just 1 bit per cell.

The 3-bit flash cells have $2^3$ or 8 levels, which correspond to read sub-states 2, 5, 8, 11, 14, 17, 20, 23. The read in-range output is generated for these sub-states, when the bit-line voltage is between upper and lower target voltages VUx, VLx, where x is 0, 1, 2, 3, . . . 6, 7 for the 8 sub-states 2, 5, 8, 11, 14, 17, 20, 23, respectively. When the bit-line voltage is just above these target ranges, but still below the next read reference voltage VR(x+1), then the over-program signal is activated instead of the in-range signal. When the bit-line voltage is just below these target ranges, but still above the next read reference voltage VRx, then the under-program signal is activated instead of the in-range signal.

The full, non-downgraded flash cells generate 3 read-data bits D2, D1, D0 from translation logic 60, as shown in the "3-Bit Usage" columns of the truth table. For example, read sub-state 5, occurring when the bit-line voltage is between VL1, VU1, produces read data of 110. Sub-states 19-21 produce read-data 001.

When the flash block is downgraded to 2-bit per cell, only read data bits D2, D1 are used. The least-significant-bit (LSB) D0 is ignored, as shown by the dashes in the "2-Bit Usage" columns of the table. However, sub-states are merged to increase noise margins, such as sub-states 2-5 for logic value 11.

When the flash block is downgraded to 1-bit per cell, only most-significant bit (MSB) read data bit D2 is used. The least-significant-bits (LSBs) D1, D0 are ignored, as shown by the dashes in the "1-Bit Usage" columns of the table. Sub-states are further merged, such as sub-states 2-11 for logic 1.

Noise margins are improved when downgrading occurs. For example, when the 3-bit cell is downgraded to 1-bit per cell, and the cell is programmed into sub-state 17, the cell is programmed into the narrow target voltage range of VL5, VU5. However, the correct data D2=0 is read over the much wider voltage range of VR4 to Vcc. The lower noise margin is increased to VL5 to VR4, while the upper noise margin is increased to VU5 to Vcc.

The truth table of FIG. 10 could be expanded for larger density MLC's. For example, a 4 bits-per-cell MLC cold has another read-data bit, D3, as the MSB above D2, D1, D0. The number of in-range levels increases from 8 to 16, and the number of sub-states increases from 24 to 48. The number of comparator inputs increases from 23 to 48. This MLC can be downgraded first from 4 bits/cell to 3 bits/cell, then again to 2 bits/cell, and a third downgrade to 1 bit/cell.

Figure 11:
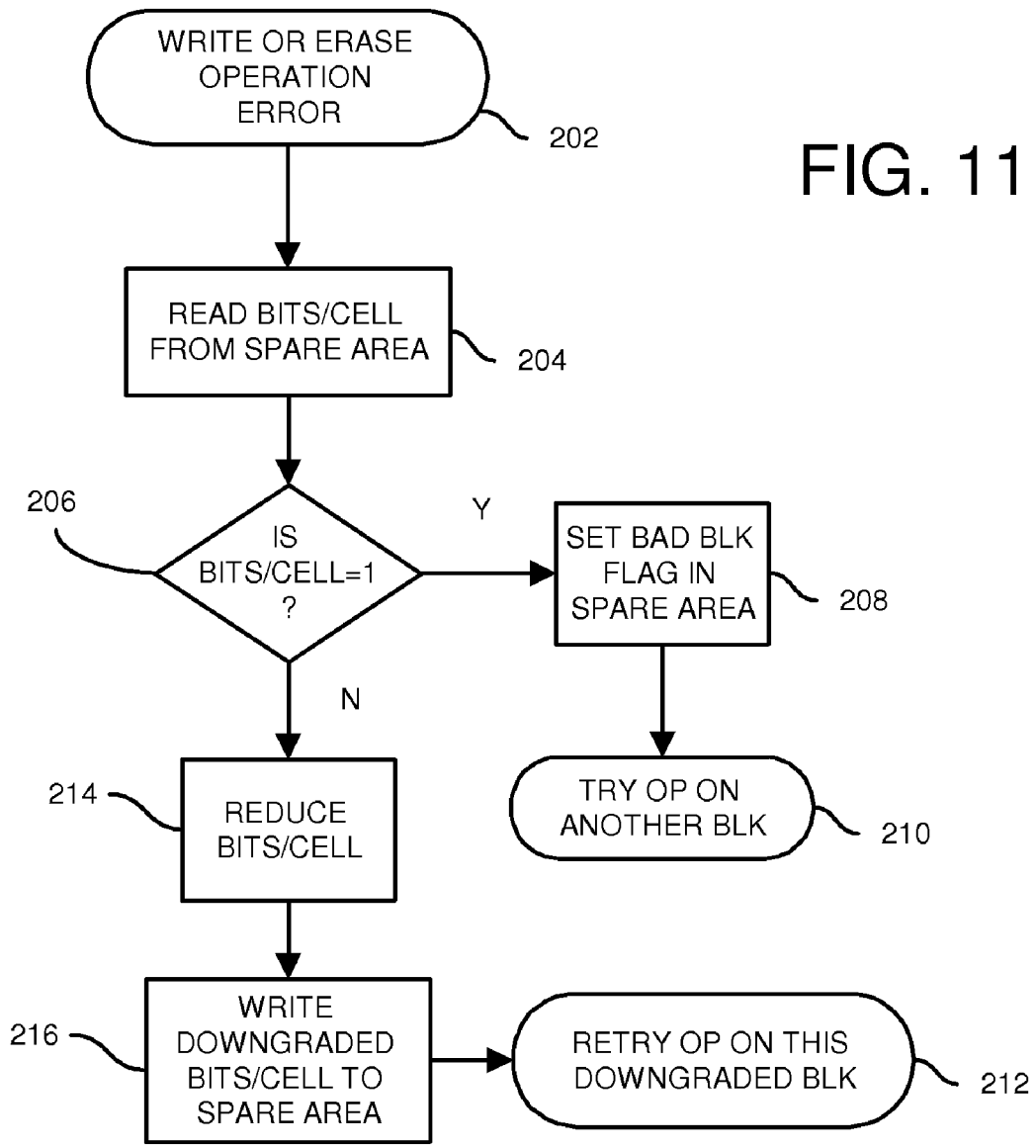
FIG. 11 is a flowchart of MLC downgrading during write or erase operations.

FIG. 11 is a flowchart of MLC downgrading during write or erase operations. When an error occurs during a write or erase operation, step 202, when the ECC checker flagged that too many errors occurred during reading, or during low-activity periods, this downgrading routine is activated. The bits-per-cell indicator is read from the spare area for the block (FIG. 4) or from the special block (FIG. 5), step 204. When the bits-per-cell indicator is already 1 bit per cell, step 206, the cell has been previously downgraded to the minimum density, yet errors are still occurring. Downgrading was unsuccessful. The block is marked as a bad block by clearing bits in the bad block byte (FIG. 4) in the spare area, step 208. This block is now removed from future usage. Another block can be chosen for this operation if necessary, step 210.

When the block has its bits-per-cell indicator set to 2 or more bits per cell, step 206, then the block can be downgraded. The number of bits/cell read from the bits-per-cell indicator in the spare areas of the block is reduced to the next-lower level, such as from 4 bits/cell to 3 bits/cell, step 214. The size of the block may decrease, or the arrangement of block may change to accommodate the reduced number of bits per cell. For example, the block size can be cut in half on a downgrade from 4 bits/cell to 3 bits/cell. Pages in the block can have half the number of logical sectors after the downgrade.

The reduced bits/cell is written to the bits-per-cell indicator for the downgraded block, step 216. The write or erase operation can then be re-executed on the downgraded block, step 212. When the downgrade routine was activated by an excess of read errors, the block can be erased once the data has been read and relocate to another block.

Figure 12:
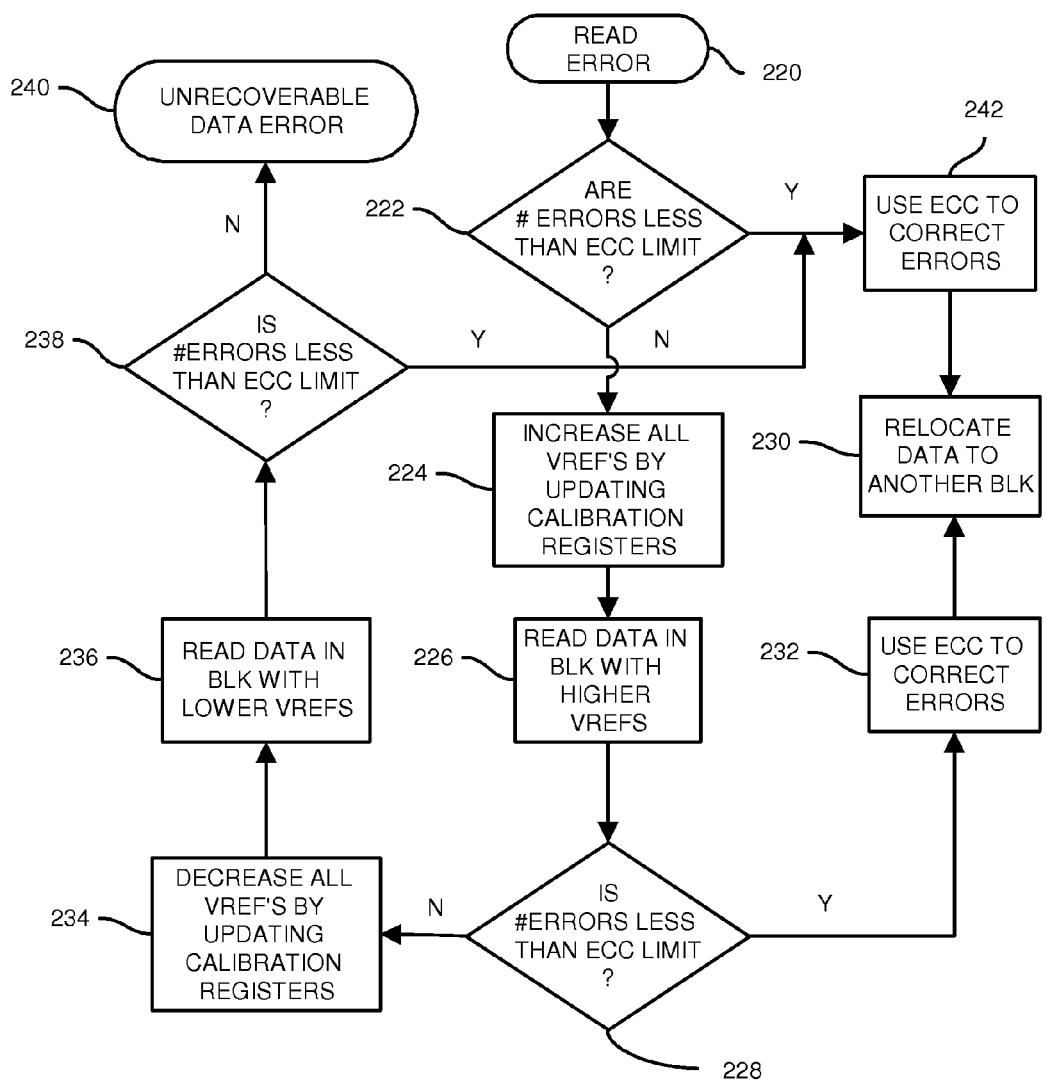
FIG. 12 is a flowchart of read error correction using ECC bytes and by adjusting voltage references.

FIG. 12 is a flowchart of read error correction using ECC bytes and by adjusting voltage references. Read errors can be detected by checking the data read to the ECC bytes. For example, a non-zero syndrome generated from the data and the ECC bytes can signal that an error occurred, and may signal the bit-location of the error and the correction for the error.

When a read error is detected, step 220, this routine is activated. When the number and location of the errors allows the errors to be corrected using the ECC bytes, step 222, then the ECC bytes can be used to correct the read errors, step 242. The data can be re-located to another block, step 230, and the block erased and optionally downgraded with the bits-per-cell indicator.

The number of fixable errors can be a fixed number, such as an ECC limit, or can vary with the locations of the errors, such as any 3 bits in a byte, or any string of 4 bad bits. The ECC limit could also be arbitrarily set, or could be set to a lower value that is correctable, but still undesirable and indicitive of a block that should be downgraded even though its errors were correctable.

When the number of errors exceeds the ECC limit, step 222, then the ECC mechanism cannot correct all the errors. Data may be lost. An attempt is made to recover the lost data by adjusting the voltage reference levels that are compared to the bit-line voltage. Calibration registers 122 (FIG. 7) are written to with new values to cause voltage reference generator 120 to generate a higher upper reference voltage, step 224. This causes all reference voltages in the chain to be increased slightly. The data in the block is read using these higher references, step 226. The data can then be checked for errors using the ECC bytes. When the number of errors decreases to below the ECC limit, step 228, raising the references was successful. The lost data was recovered. The ECC bytes can be used to correct all the remaining errors, step 232, and the data re-located to another block, step 230. This block can be downgraded by calling the downgrade routine of FIG. 11.

Increasing the reference voltages is sometimes successful when the amount of negative charge stored in the floating gate of flash cells increases. Negative charge can increase due to cell disturbance from reading or programming adjacent cells. The excess negative charge requires a higher gate voltage to compensate, so raising references can be effective.

When the number of errors is still above the ECC limit, step 228, then raising the reference voltages was not successful. The references could be raised further by repeating steps 224-228 (not shown) some number of times.

When raising the references fails to recover data, the references can be lowered. Calibration registers 122 (FIG. 7) are written with new values to cause voltage reference generator 120 to generate a lower upper reference voltage, step 234. This causes all reference voltages in the chain to be decreased slightly. The data in the block is read using these lower references, step 236. The data can then be checked for errors using the ECC bytes. When the number of errors decreases to below the ECC limit, step 238, lowering the references was successful. The lost data was recovered. The ECC bytes can be used to correct all the remaining errors, step 242, and the data re-located to another block, step 230. This block can be downgraded by calling the downgrade routine of FIG. 11.

Decreasing the reference voltages is sometimes successful when the amount of negative charge stored in the floating gate of flash cells decreases. Leakage can cause negative charge to decrease. The reduced negative charge causes extra channel current to flow through the selected flash cell in response to a fixed gate voltage. The extra channel current causes the bit-line voltage to be lower than usual. Thus the references must be lowered to compensate for the cell leakage.

When the number of errors is still above the ECC limit, step 238, then lowering the reference voltages was not successful. The references could be lowered further by repeating steps 234-238 (not shown) some number of times. However, when the number of data errors does not fall below the ECC limit, the data is lost. An unrecoverable data error is signaled, step 240.

Example Reed Soloman ECC pseudo-code:
RS(n,k);
$2t=n-k$;
k is the data size; n is the maximal total data+RS_ECC
n is depend on the size of symbol ($n=2**s-1$)
The total bits involved is n*s.
If $s=8$; $n=255$; data+RS_ECC=255*8;
  a. $t=8$; $255-2*8=239$ (239>172)
    Problem: 16*8
      we need 16 bytes, the spare area for 512 bytes is 16 bytes.
  b. $t=4$;
    Problem: 8*8
      we need 8 bytes, the spare area for 512 bytes is 16 bytes.
  b. $t=2$;
    Problem: 4*8
      we need 4 bytes, the spare area for 512 bytes is 16 bytes.
If $s=9$; $n=511$; data+RS_ECC=511*9=574*8+7
  a. $t=16$; $511-2*16=479$ (479*9/8=538>512)
    Problem: 32*9=288=36*8
      we need 36 bytes, the spare area for 512 bytes is 16 bytes.
  b. $t=8$;
    Problem: 16*9=144=18*8
      we need 18 bytes, the spare area for 512 bytes is 16 bytes.
      BCH need 104 bits=13*8
  c. $t=4$;
    Problem: 8*9=72=9*8
      we need 9 bytes, the spare area for 512 bytes is 16 bytes.
If $s=10$; $n=1023$; data+RS_ECC=1023*10=1278*8+6
  a. $t=16$; $1023-2*16=991$ (991*10/8=1238>1024)
    Problem: 32*10=320=40*8
      we need 40 bytes, the spare area for 1 Kbytes is 32 bytes.
  b. $t=8$;
    Problem: 16*10 =160=20*8
      we need 20 bytes, the spare area for 1 Kbytes is 32 bytes.
  c. $t=4$;
    Problem: 8*10=80=10*8
      we need 10 bytes, the spare area for 1 Kbytes is 32 bytes.
If $s=11$; $n=2047$; data+RS_ECC=2047*11=2814*8+5
  a. $t=16$; $2047-2*16=2015$ (2015*11/8=2770>2048)
    Problem: 32*11=352=44*8
      we need 44 bytes, the spare area for 2 Kbytes is 64 bytes.
  b. $t=8$;
    Problem: 16*11=176=22*8
      we need 22 bytes, the spare area for 2 Kbytes is 64 bytes.
  c. $t=4$;
    Problem: 8*11=88=11*8
      we need 11 bytes, the spare area for 2 Kbytes is 64 bytes.

ALTERNATE EMBODIMENTS

Several other embodiments are contemplated by the inventors. For example, the number of pages per block can be 4, 8, 16, 32, 64, or some other number. The number of physical blocks in the system can increase, and blocks can be partitioned among data and overhead pools in various ways and also dynamically. The sector size could vary from the 512-byte sector described. The page size can be 512 bytes, 2K, 4K bytes or higher, and could dynamically vary with the bits-per-cell indicator for multi-level cell flash memory, but the sector size inherited from hard disk drives may remain 512 bytes for compatibility reasons. Other bits may be stored with each page or with each block, such as LRU bits, management or coherency bits, dirty bits, other counters, etc.

The reference voltages could be adjusted for other reasons, such as to track temperature, process, and supply-voltage variations. Comparators could be differential comparators or op amps. Differential bit lines rather than single bit lines could be substituted. Various sense amps, latches, pre-charge, logic, buffering, and other circuitry could be added. A variety of floating-gate and other technologies could be used for cell storage.

Blocks or pages could be downgraded. The bits-per-cell indicator could be a single indicator for a block, or separate indicators for pages, or redundant indicators. Blocks that contain critical data such as boot code could remain in a downgraded state to improve reliability, even when no errors occur.

Some blocks may be faulty and are removed from the pool of erased blocks. A flash-memory controller may implements the functions described and be located on a flash-memory card or motherboard or other card. A host bus such as a Peripheral Component Interconnect Express (PCIE) bus with a PCIE interface, or a USB interface to a USB bus may be added. Rather than being on a card, the device might be a module or may be located on one or more chips or on several boards or on a motherboard.

Different kinds of flash memory may erase to 0, and only allow writing to 1, not writing from 1 to 0. Some flash memory may allow page erase, rather than whole block erase. Events may occur exactly when described, or could occur at other times. Valid bits may change to the erased state near but not exactly at the time of physical erasing, such as before or after the actual erase operation. Pipelining, buffering, and other time-shifting operations may be used. Wait states that delay operations may be added, such as when erasing is very slow.

Other algorithms could be used, such as counting backwards in binary code, gray code, or using 2's complement, or right-shifting zeros. Incrementing can refer to decrementing, and bits could be set to 0 rather than just set to 1, or cleared to 1,1, since inverted bit states or polarities may be used.

Counter could contain many bits, such as 32 bits rather than 8 bits, allowing for counting up to 32 without erasing from 0 to 1. Counting sequences that minimize bit changes from 0 to 1 could be used, with bit changes from 0 to 1 occurring when a new current block is started, perhaps by skipping other values in the sequence. Since old blocks are erased, a large count value may not be needed, as the count could be reset periodically when all block have been erased.

Page order may vary, such as by checking pages 1, 3 first, then checking pages 0,2. Many other sequences may be substituted. Various other steps such as validating data may be added. The flash-memory card may have its own flash-memory array or may use flash memory on another bus, such as on a USB flash card. Some caching operations or other workload could be processed by the host or by another processor such as the I/O processor, and could be partitioned among software, firmware, and hardware. The flash-memory card could be a printed-circuit board (PCB), a smaller plug-in card or device, a device with an external chassis, a board or rack in a larger chassis, or may be integrated with other components or with the host. The data stored may come from one or more hosts, peripheral devices, bus masters, or various other sources.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A downgradable cell-density flash-memory system comprising:

a flash memory arranged as blocks of multiple pages, wherein pages are written and blocks are erased, wherein individual pages are not individually erasable except by erasing all pages in the block;

multi-level memory cells in the flash memory that each store B logical bits per cell, wherein the multi-level memory cells each store charge in one of $2^B$ levels to represent the B logical bits;

a bit line coupled to a selected cell in the multi-level memory cells;

a plurality of references generated from a first reference, the plurality of references being in a sequence of differing values;

a plurality of comparators that generate a plurality of compare results by comparing the bit line to the plurality of references;

translation logic that receives the compare results as inputs, and generates B read data bits for the selected cell;

a bits-per-cell indicator stored for a selected block of the multi-level memory cells, the selected block containing the selected cell, the bits-per-cell indicator indicating when the selected cell stores B logical bits, and when the selected cell stores a downgraded number D of logical bits less than B logical bits;

first downgrade logic, responsive to the bits-per-cell indicator, for blocking a least-significant of the B read data bits when the bits-per-cell indicator indicates that the selected cell stores D=B−1 logical bits; and second downgrade logic, responsive to the bits-per-cell indicator, for blocking a second least-significant of the B read data bits when the bits-per-cell indicator indicates that the selected cell stores D=B−2 logical bits;

wherein B, D are whole numbers and B is at least 3;

whereby least-significant bits in the B logical bits are blocked when the selected cell is downgraded by the bits-per-cell indicator.

2. The downgradable cell-density flash-memory system of claim 1 further comprising:

Error Correction Code (ECC) bytes stored for the selected block, the ECC bytes for correcting data bytes in the selected block;

a bits-per-cell downgrader, activated when the ECC bytes are insufficient to correct errors in data bytes in the selected block, the bits-per-cell indicator reducing the downgraded number D of logical bits, whereby bits stored per cell are reduced when errors are not correctable by the ECC bytes.

3. The downgradable cell-density flash-memory system of claim 2 wherein the bits-per-cell indicator and the ECC bytes are stored in a spare area of the selected block.

4. The downgradable cell-density flash-memory system of claim 2 further comprising:

a calibration register for storing a calibration value that is updatable;

a voltage reference generator that generates the first reference in response to the calibration value from the calibration register;

a data recovery unit, activated when the ECC bytes are insufficient to correct errors in data bytes in the selected block, for adjusting the calibration value in the calibration register and to re-read the selected cell using adjusted values for the plurality of references, whereby data recovery is attemptable by adjusting the plurality of references.

5. The downgradable cell-density flash-memory system of claim 1 wherein the plurality of references comprises $2^B$ pairs of target references;

wherein the translation logic generates a different value of the B read data bits for each of the $2^B$ pairs of target references;

wherein the plurality of references further comprises $2^B-1$ segment references;

wherein the selected cell is programmed until the bit line is between a selected one of the pairs of target references that is determined by B write data bits.

6. The downgradable cell-density flash-memory system of claim 5 further comprising:

an in-range signal generated by the translation logic when the bit line is between a pair of target references in the plurality of references;

an over signal generated by the translation logic when the bit line is above the pair of target references but not over a next segment reference; and an under signal generated by the translation logic when the bit line is below the pair of target references but not below a prior segment reference.

7. The downgradable cell-density flash-memory system of claim 6 wherein downgraded multi-level memory cells have asymmetric noise margins, wherein an upper voltage difference from an upper voltage of the target pair to an upper segment reference at a transition to a prior logic value of the downgraded number D of logical bits is not equal to a lower difference from a lower voltage of the target pair to a lower segment reference at a transition to a next logic value of the downgraded number D of logical bits, whereby asymmetric noise margins occur when the multi-level memory cells are downgraded.

8. The downgradable cell-density flash-memory system of claim 2 further comprising:

third downgrade logic, responsive to the bits-per-cell indicator, for blocking a third least-significant of the B read data bits when the bits-per-cell indicator indicates that the selected cell stores D=B−3 logical bits.

9. The downgradable cell-density flash-memory system of claim 8 wherein critical code is stored in blocks having the bits-per-cell indicator set to D=1 bit stored per multi-level memory cells, whereby critical code is stored at lowest cell density.

10. A method for downgrading multi-level memory cells in a flash memory comprising:

reading a bits-per-cell indicator for a block of the multi-level memory cells to determine a number of logical bits stored in each of the multi-level memory cells;

reading data from the multi-level memory cells by comparing a bit-line voltage driven by a selected cell in the multi-level memory cells to a plurality of reference voltage levels;

determining when an error occurs while reading the data from the multi-level memory cells;

relocating data in the block to a new block when the error occurs;

when the bits-per-cell indicator for the block is at a minimum density of 1 bit per cell and the error is detected, marking the block as a bad block after the data in the block is relocated;

reducing a value of the bits-per-cell indicator for the block to generated a downgraded value when the error is detected and the data in the block is relocated;

writing the downgraded value to the bits-per-cell indicator for the block; and writing new data to the block wherein a number of logical bits stored in each of the multi-level memory cells in the block is the downgraded value;

whereby the block is downgraded to the downgraded value of logical bits per cell when the error occurs.

11. The method of claim 10 wherein determining when the error occurs comprises:

reading Error Correction Code ECC bytes from the block and reading data bytes from the block;

generating an error-check result from the ECC bytes and from the data bytes;

determining a number of errors in the data bytes using the error-check result;

comparing the number of errors to an ECC limit;

correcting data errors in the data bytes using the ECC bytes when the number of errors is less than the ECC limit and not reporting the error;

reporting the error when the number of errors is more than the ECC limit, whereby the error is reported when the number of errors exceeds the ECC limit.

12. The method of claim 11 further comprising:

recovering the data bytes as recovered data bytes when the number of errors is more than the ECC limit;

relocating the recovered data bytes to the new block; and reporting the error when the recovered data bytes are relocated.

13. The method of claim 12 wherein recovering the data bytes comprises:

writing an adjusted value to a calibration register;

adjusting a first reference voltage generated by a voltage reference generator in response to the adjusted value in the calibration register;

adjusting the plurality of reference voltage levels, wherein the plurality of reference voltage level is generated from the first reference voltage in response to the adjusted value;

applying the plurality of reference voltage levels to a series of comparators that also receive the bit-line voltage that is driven by the selected cell in the multi-level memory cells; and decoding compare results from the series of comparators to generate the recovered data bytes, whereby recovered data is read after adjusting the plurality of reference voltage levels.

14. The method of claim 13 wherein adjusting the first reference voltage comprises increasing the first reference voltage and decreasing the first reference voltage.

15. The method of claim 14 wherein adjusting the first reference voltage comprises successively increasing the first reference voltage and successively decreasing the first reference voltage until the number of errors is below the ECC limit.

16. The method of claim 10 wherein reducing the value of the bits-per-cell indicator for the block to generated the downgraded value when the error is detected and the data in the block is relocated comprises:

reducing the value of 4 bits per cell to the downgraded value of 3 bits per cell when 4 logical bits are stored per cell;

reducing the value of 3 bits per cell to the downgraded value of 2 bits per cell when 3 logical bits are stored per cell; and reducing the value of 2 bits per cell to the downgraded value of 1 bits per cell when 2 logical bits are stored per cell.

17. A downgradable flash memory with multi-level memory cells comprising:

multi-level-cell (MLC) flash memory means for storing multiple bits of data per multi-level memory cell, arranged as blocks of multiple pages, wherein pages are written and blocks are erased, wherein individual pages are not individually erasable except by erasing all pages in the block;

bits-per-cell indicator means for indicating a number of logical bits stored in each of the multi-level memory cells in the block;

voltage compare means for comparing a bit-line voltage driven by a selected cell in the multi-level memory cells to a plurality of reference voltage levels to generate compare results;

error detect means for determining when an error occurs while reading the data from the multi-level memory cells;

relocate means for relocating data in the block to a new block when the error occurs;

bad block means for marking the block as a bad block after the data in the block is relocated when the bits-per-cell indicator means for the block is at a minimum density of 1 bit per cell and the error is detected, cell downgrade means for reducing a value of the bits-per-cell indicator means for the block to generated a downgraded value when the error is detected and the data in the block is relocated;

reduced cell-density write means for writing new data to the block wherein a number of logical bits stored in each of the multi-level memory cells in the block is the downgraded value;

whereby the block is downgraded to the downgraded value of logical bits per cell when the error occurs.

18. The downgradable flash memory of claim 17 wherein the error detect means further comprises:

read means for reading Error Correction Code ECC bytes from the block and reading data bytes from the block;

check generator means for generating an error-check result from the ECC bytes and from the data bytes;

error count means for determining a number of errors in the data bytes using the error-check result;

limit compare means for comparing the number of errors to an ECC limit;

correction means for correcting data errors in the data bytes using the ECC bytes when the number of errors is less than the ECC limit and not reporting the error;

report mans for reporting the error when the number of errors is more than the ECC limit, whereby the error is reported when the number of errors exceeds the ECC limit.

19. The downgradable flash memory of claim 18 further comprising:

recovery means for recovering the data bytes as recovered data bytes when the number of errors is more than the ECC limit;

recovered relocate means for relocating the recovered data bytes to the new block; and report means is also for reporting the error when the recovered data bytes are relocated.

20. The downgradable flash memory of claim 19 wherein the recovery means further comprises:

calibration register means for storing an adjusted value;

voltage reference generator means for generating an adjusted first reference voltage in response to the adjusted value in the calibration register means;

levels means for adjusting the plurality of reference voltage levels, wherein the plurality of reference voltage level is generated from the adjusted first reference voltage in response to the adjusted value;

translation logic means for decoding compare results from the series of comparators to generate the recovered data bytes, whereby recovered data is read after adjusting the plurality of reference voltage levels.

* * * * *